(12) United States Patent
Gupta et al.

(10) Patent No.: US 11,728,285 B2
(45) Date of Patent: Aug. 15, 2023

(54) SEMICONDUCTOR DEVICE PACKAGING WARPAGE CONTROL

(71) Applicant: NXP USA, INC., Austin, TX (US)

(72) Inventors: Vivek Gupta, Phoenix, AZ (US); Michael B. Vincent, Chandler, AZ (US); Scott M. Hayes, Chandler, AZ (US); Richard Te Gan, Chandler, AZ (US); Zhiwei Gong, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 154 days.

(21) Appl. No.: 17/412,327

(22) Filed: Aug. 26, 2021

(65) Prior Publication Data
US 2023/0066652 A1 Mar. 2, 2023

(51) Int. Cl.
*H01L 23/00* (2006.01)
*H01L 21/48* (2006.01)
*H01L 23/13* (2006.01)
*H01L 21/56* (2006.01)

(52) U.S. Cl.
CPC .......... *H01L 23/562* (2013.01); *H01L 21/481* (2013.01); *H01L 21/4807* (2013.01); *H01L 21/4878* (2013.01); *H01L 21/561* (2013.01); *H01L 23/13* (2013.01)

(58) Field of Classification Search
CPC ...................................................... H01L 24/94
See application file for complete search history.

(56) References Cited

U.S. PATENT DOCUMENTS

| | | | |
|---|---|---|---|
| 7,950,144 B2 | 5/2011 | Ramanathan et al. | |
| 8,758,552 B2 | 6/2014 | Canale et al. | |
| 8,829,661 B2 | 9/2014 | Lytle et al. | |
| 8,832,924 B2 | 9/2014 | Mizubata | |
| 9,107,303 B2 | 8/2015 | Lytle et al. | |
| 9,420,694 B2 | 8/2016 | Chung | |
| 9,941,219 B2 | 4/2018 | Rorane et al. | |
| 2004/0188817 A1* | 9/2004 | Hua | H01L 23/3677 257/E23.101 |
| 2009/0079064 A1* | 3/2009 | Tang | H01L 24/96 257/723 |
| 2012/0048605 A1 | 3/2012 | Chung | |
| 2012/0139192 A1 | 6/2012 | Ooi | |
| 2016/0086894 A1 | 3/2016 | Rorane et al. | |
| 2019/0341356 A1 | 11/2019 | Chung et al. | |
| 2020/0066655 A1 | 2/2020 | Eid et al. | |

FOREIGN PATENT DOCUMENTS

JP 2015079832 A 4/2015

* cited by examiner

*Primary Examiner* — Suberr L Chi

(57) ABSTRACT

A method of manufacturing a carrier for semiconductor device packaging is provided. The method includes forming a carrier having a plurality of plateau regions separated by a plurality of channels. The carrier is configured and arranged to support a plurality of semiconductor die during a packaging operation. The plurality of channels is filled with a material configured to control warpage of the carrier.

20 Claims, 9 Drawing Sheets

SEMICONDUCTOR DEVICE PACKAGING WARPAGE CONTROL

BACKGROUND

Field

This disclosure relates generally to semiconductor device packaging, and more specifically, to semiconductor device packaging warpage control.

Related Art

Today, many electronic products include semiconductor devices formed from panel-level packaging of semiconductor die. With panel-level packaging, connections to the semiconductor die may be formed after panel encapsulation. After encapsulation, there is a problem referred to as panel warping that can occur as an effect of the encapsulation, redistribution, or other process steps, for example. Warping is of particular concern in panel-level packaging as forming connections to the semiconductor die can be difficult thus affecting yield, reliability, costs, and panel handling through processing. Therefore, it is desirable to overcome problems associated with panel-level warpage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a reusable warpage control carrier for semiconductor device packaging. The warpage control carrier includes a plurality of plateau regions separated by channels. In one aspect, the plateau regions may be formed by way of an additive process whereby material is added to a base portion of the carrier. For example, the plateau regions may be formed by attaching prefabricated structures having desired dimensions to the base portion of the carrier. In this manner, the spacing between the attached prefabricated structures forms the channels. In another aspect, the plateau regions may be formed by way of a subtractive process whereby material is removed from a bulk portion of the carrier. For example, portions of bulk material may be removed by way of etching, sawing, laser ablation, or combinations thereof to form the channels having desired dimensions. As a result, the plateau regions are formed having desired dimensions and spacing from one another. With the plateau regions and corresponding channels formed, a structural material is dispensed or otherwise deposited to fill the channels. The structural material serves to augment structural properties of the carrier in a manner that minimizes warpage during semiconductor device packaging operations. By minimizing warpage during semiconductor device packaging operations, improved yield, reliability, and costs may be realized.

Figure 1:
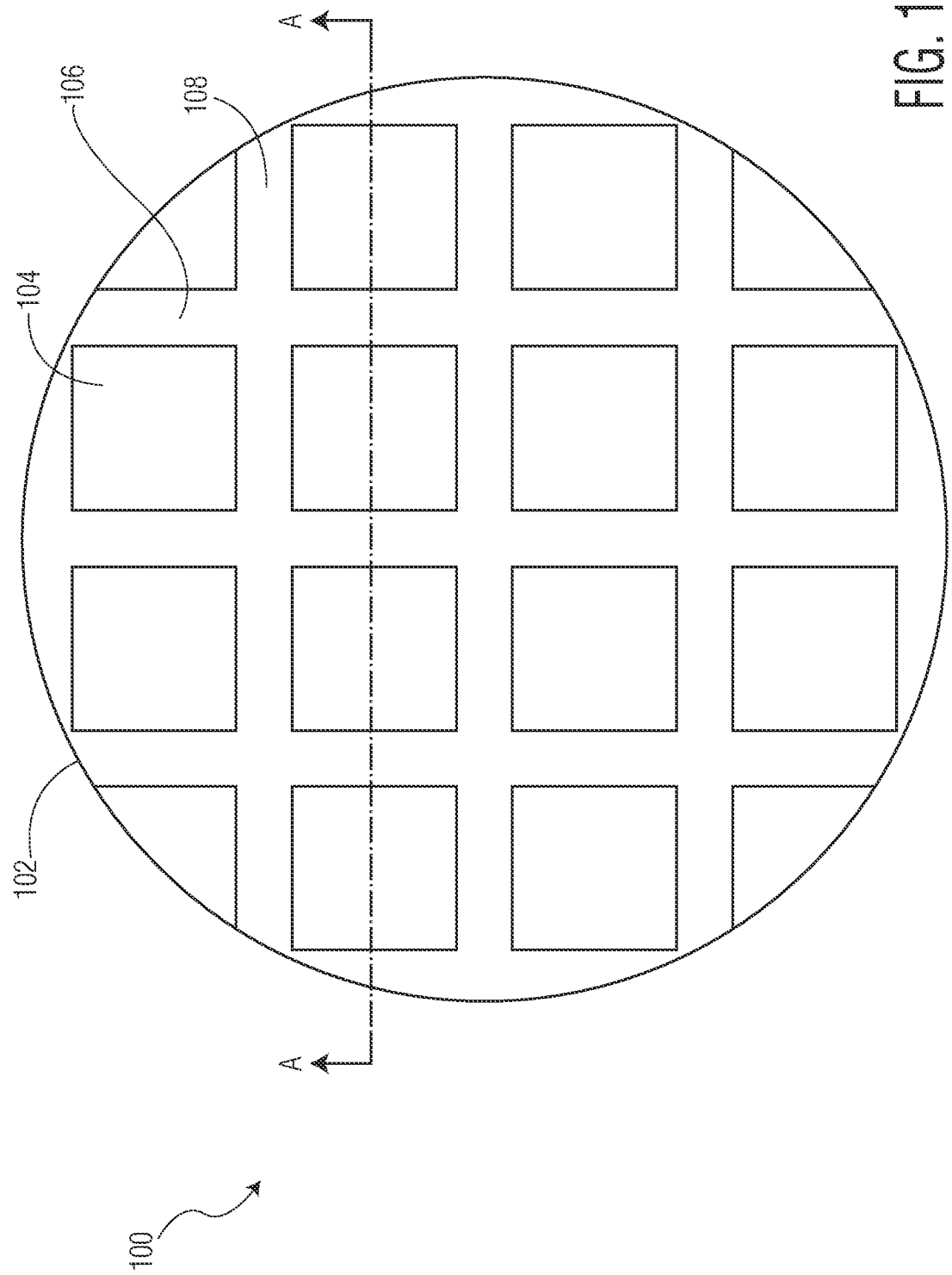
FIG. 1 illustrates, in a simplified plan view, an example warpage control carrier at a stage of manufacture in accordance with an embodiment.

FIG. 1 illustrates, in a simplified plan view, an example warpage control carrier 100 at a stage of manufacture in accordance with an embodiment. At this stage of manufacture, the carrier 100 includes a base portion 102, a plurality of plateau regions 104, and a plurality of channels 106 and 108. In this embodiment, the carrier 100 is depicted as a round carrier having 12 plateau regions, for example. The number and arrangement of the plateau regions 104 in this embodiment are chosen for illustration purposes. In other embodiments, the carrier 100 may include any number of plateau regions and may be formed in other shapes (e.g., rectangular, square). Simplified cross-sectional views of the example carrier 100 taken along line A-A at stages of manufacture are depicted in FIG. 3 through FIG. 6.

The carrier 100 has a top major surface (e.g., top surface of the plateau regions 104) and a bottom major surface (e.g., major surface opposite of the top major surface). In this embodiment, the plurality of plateau regions 104 are separated by the plurality of channels 106 and 108. As depicted in FIG. 1, the plurality of channels 106 are formed with a vertical orientation and the plurality of channels 108 are formed with a horizontal orientation. The carrier 100 is configured and arranged to provide a temporary structure for supporting a plurality of semiconductor die and encapsulation during semiconductor device packaging operations. An adhesive, double-sided tape or film, or the like may be applied to the top major surface of the carrier 100 to facilitate temporary die attachment and subsequent encapsulation, for example. The carrier 100 may be formed from a suitable material such as metal, glass, quartz, ceramic, silicon wafer, or the like. The carrier 100 may be formed in any suitable shape such as round, square, or rectangular. An alternative example carrier 200 formed in a rectilinear shape is depicted in FIG. 2, for example.

Figure 2:
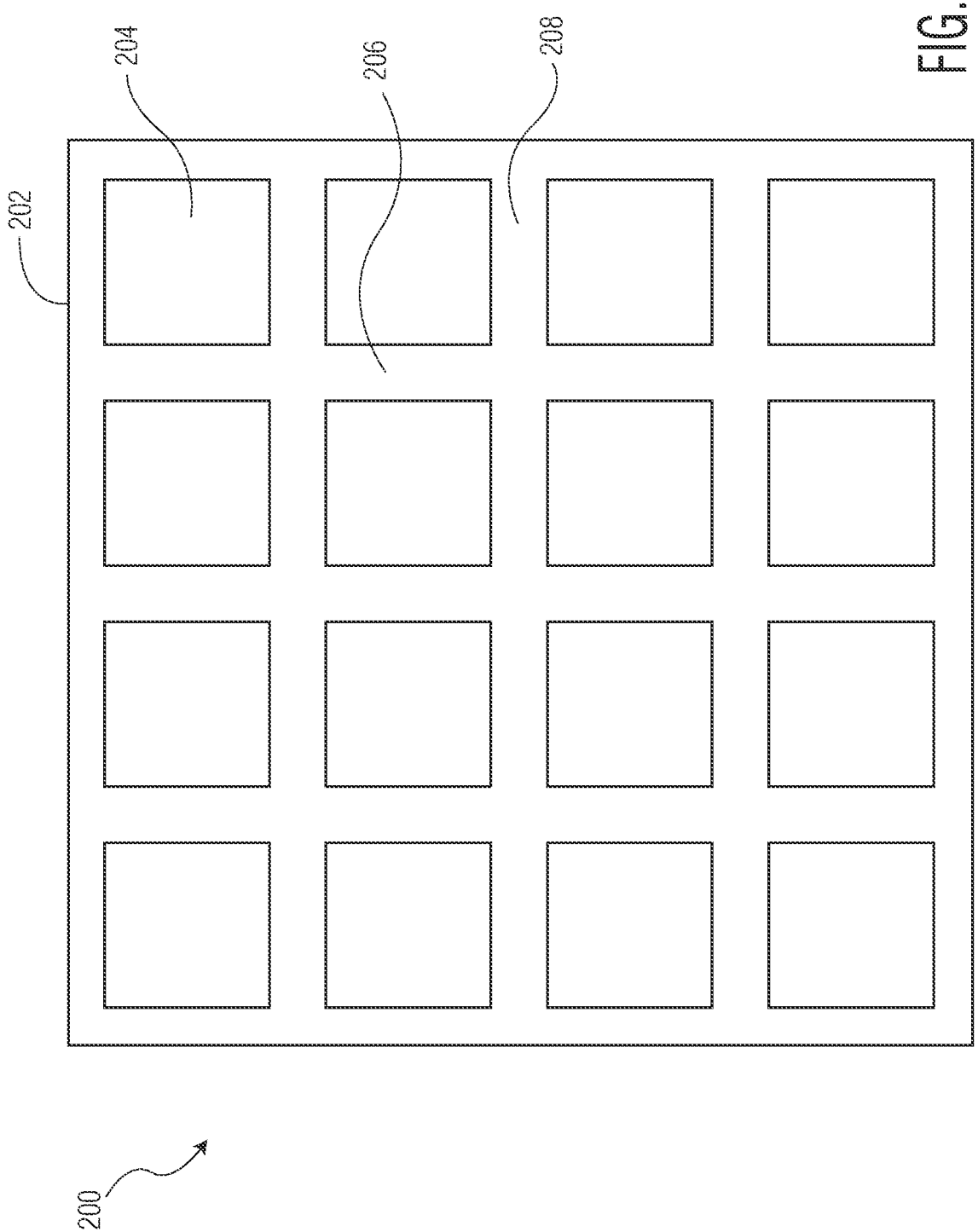
FIG. 2 illustrates, in a simplified plan view, an alternative example warpage control carrier at a stage of manufacture in accordance with an embodiment.

FIG. 2 illustrates, in a simplified plan view, an alternative example warpage control carrier 200 at a stage of manufacture in accordance with an embodiment. At this stage of manufacture, the carrier 200 includes a base portion 202, a plurality of plateau regions 204, and a plurality of channels 206 and 208. In this embodiment, the carrier 200 is depicted as a substantially square carrier having 16 plateau regions, for example. The number and arrangement of the plateau regions 204 in this embodiment are chosen for illustration purposes.

The carrier 200 has a top major surface (e.g., top surface of the plateau regions 204) and a bottom major surface (e.g., major surface opposite of the top major surface). In this embodiment, the plurality of plateau regions 204 are separated by the plurality of channels 206 and 208. As depicted in FIG. 2, the plurality of channels 206 are formed with a vertical orientation and the plurality of channels 208 are formed with a horizontal orientation. The carrier 200 is configured and arranged to provide a temporary structure for supporting a plurality of semiconductor die and subsequent encapsulation during semiconductor device packaging operations. The carrier 200 may be formed from a suitable material such as metal, glass, quartz, ceramic, silicon wafer, or the like.

Figure 3:
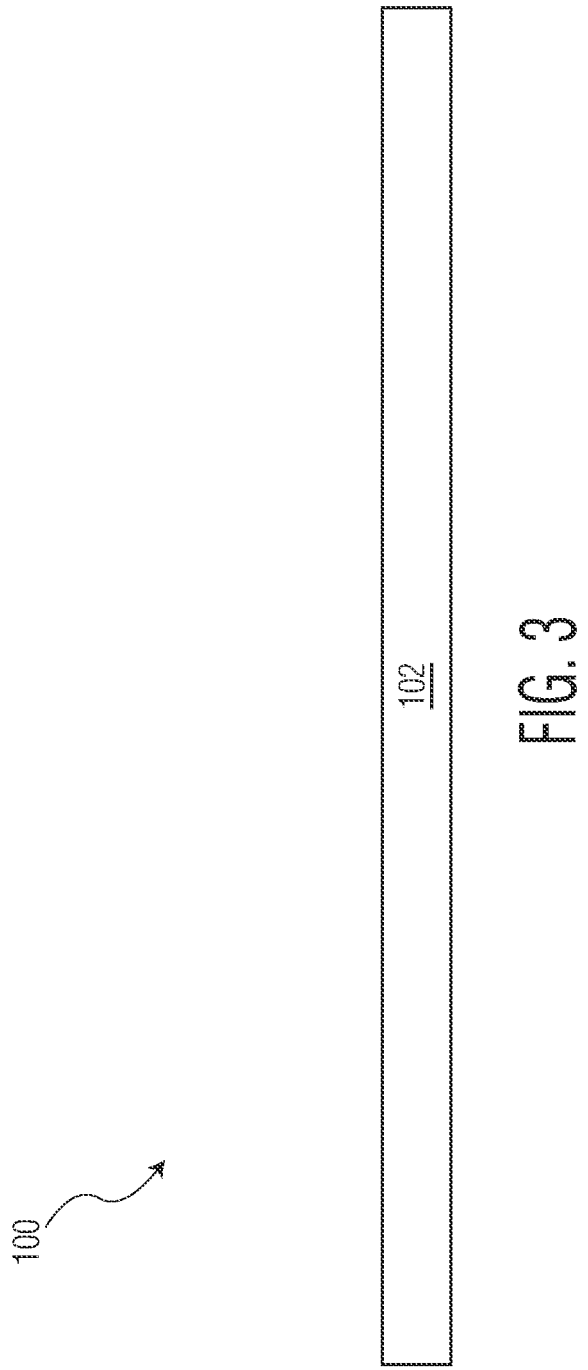
FIG. 3 through FIG. 6 illustrate, in simplified cross-sectional views, the example warpage control carrier at stages of manufacture in accordance with an embodiment.

FIG. 3 illustrates, in a simplified cross-sectional view, the warpage control carrier 100 at a stage of manufacture in accordance with an embodiment. At this stage of manufacture, the base portion 102 of the carrier 100 is provided. The base portion 102 of the carrier 100 may be formed from a suitable material such as metal, glass, quartz, ceramic, silicon wafer, or the like. In this embodiment, the plurality of plateau regions 104 is formed by way of an additive process at a subsequent stage of manufacture.

Figure 4:
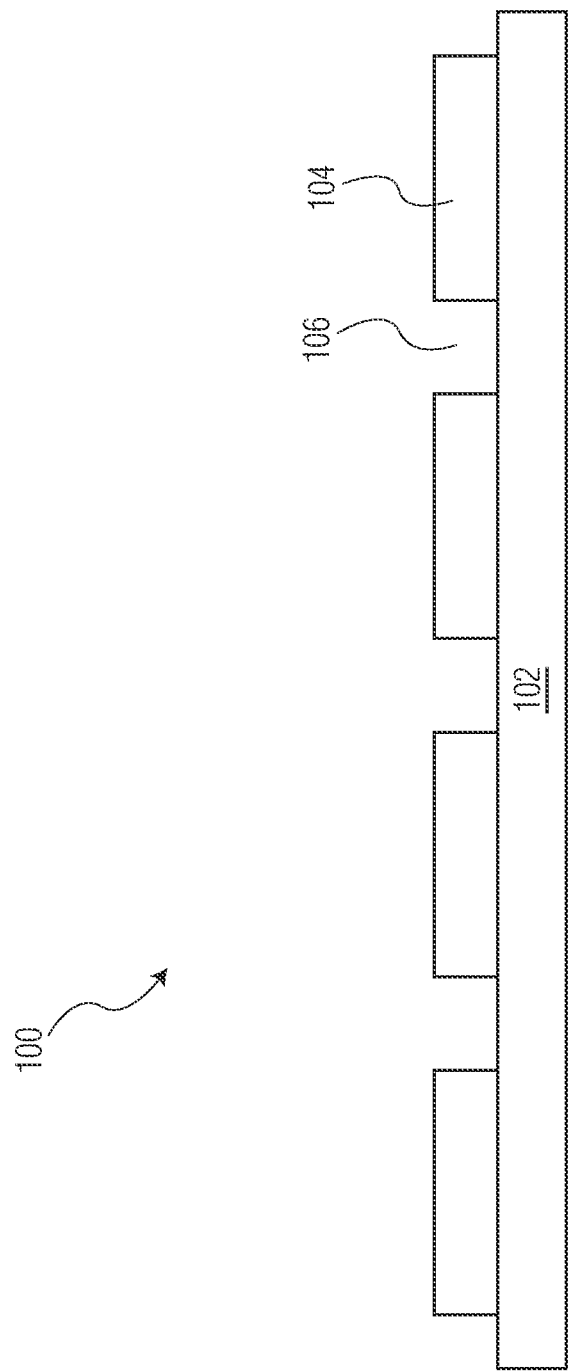

FIG. 4 illustrates, in a simplified cross-sectional view, the warpage control carrier 100 at a subsequent stage of manufacture in accordance with an embodiment. At this stage of manufacture, the plateau regions 104 are formed by way of an additive process. For example, a metal material may be deposited onto the base portion 102 and patterned to form the plurality of plateau regions 104 having desired width, length, and height dimensions. Likewise, other suitable materials may be deposited onto the base portion 102 and patterned to form the plateau regions 104. The deposited material used to form the plateau regions 104 and the base portion 102 material may be chosen for desired coefficient of thermal expansion (CTE) properties and relationship with one another. In some embodiments, the deposited material may include a same material as that of the base portion 102, for example.

In some embodiments, the plateau regions 104 may be formed by attaching prefabricated structures to the base portion 102. For example, prefabricated structures (e.g., metal, glass, quartz, ceramic, silicon) having desired width, length, and height dimensions may be attached to the base portion 102 using a pick-and-place tool, for example. The prefabricated structures may be formed from a larger structure (e.g., metal sheet, silicon wafer) then cut or diced into the desired dimensions. The materials of the prefabricated structures may be chosen for a desired CTE property and relationship with that of the base portion 102, for example. In some embodiments, the plateau regions 104 of the carrier 100 may be formed using one or multiple prefabricated structural materials. After the larger structure is cut or diced into small slabs, the small slabs are attached to the base portion 102. Each of the small slabs are spaced apart from one another by desired distance such that channels 106 and 108 are formed. In this embodiment, the width dimension of the channels 106 and 108 is determined by the distance at which the plateau regions 104 are spaced apart and the depth dimension of the channels 106 and 108 is determined by the height or thickness of the plateau regions 104. In some embodiments, dimensions of the plateau regions 104 may be varied at different regions of the carrier (e.g., from center to edge) to form different width dimensions of channels 106 and 108 for further optimization.

Figure 5:
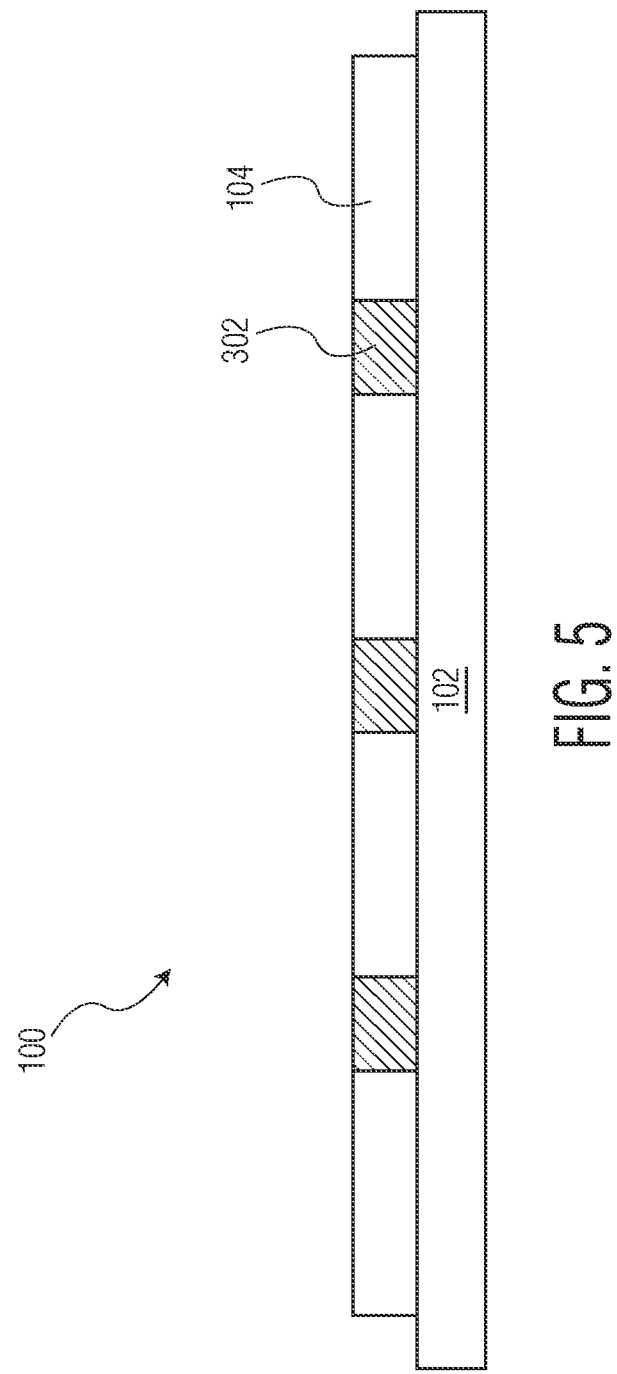

FIG. 5 illustrates, in a simplified cross-sectional view, the warpage control carrier 100 at a subsequent stage of manufacture in accordance with an embodiment. At this stage of manufacture, the channels 106 and 108 are filled with a structural material 302. In this embodiment, the channels 106 and 108 are formed having a desired width and depth such that when filled with the structural material 302, provides a structural (e.g., stiffening, stress reducing) characteristic to the carrier. In this embodiment, the structural material 302 is dispensed or otherwise deposited to fill the channels 106 and 108. After the structural material 302 is cured, a top surface of the structural material is substantially coplanar with a top surface of the plurality of plateau regions 104. The structural material 302 may be in the form of a high viscosity material (e.g., metal paste, epoxy underfill material). In some embodiments, the channels 106 and 108 of the carrier 100 may be filled using one or multiple structural materials 302.

The structural material 302 is configured to control warpage of the carrier 100 by augmenting structural properties of the carrier 100. The structural material 302 may be configured and arranged in a manner to add rigidity to the carrier, for example, during a packaging operation. In addition, the structural material 302 may be chosen having a desired CTE property which offsets or minimizes a CTE mismatch of materials to reduce warpage of the carrier during the packaging operation.

Figure 6:
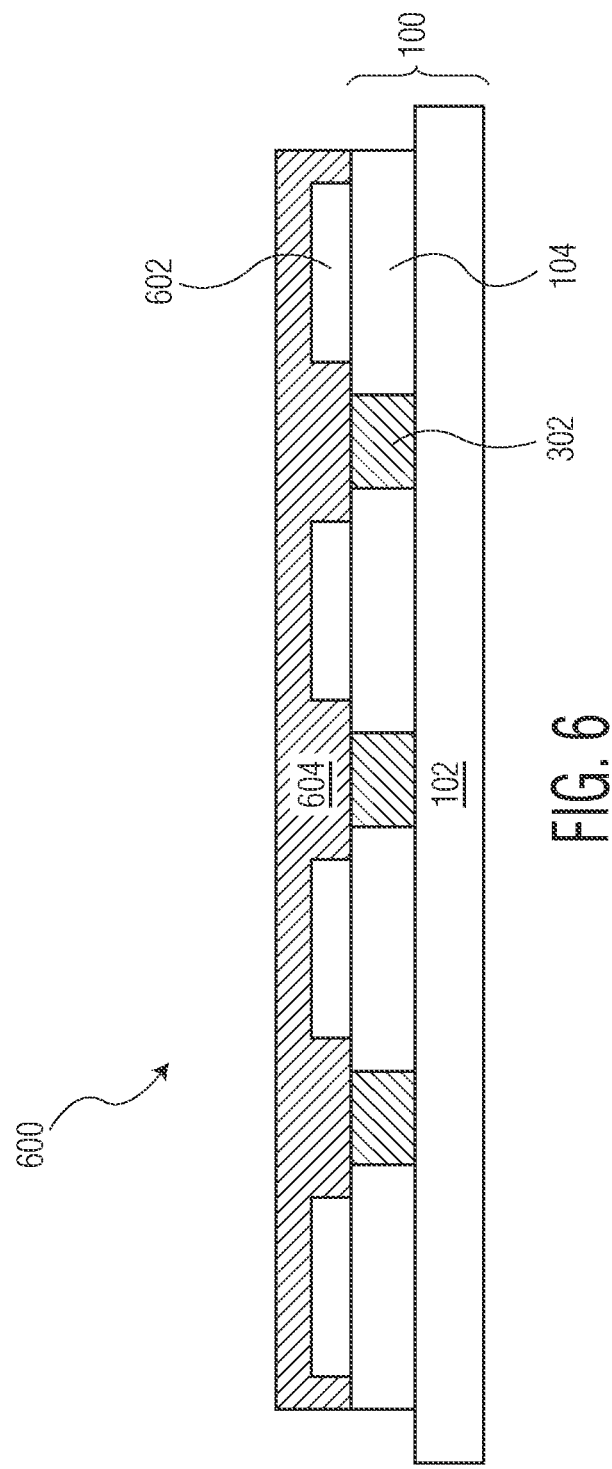

FIG. 6 illustrates, in a simplified cross-sectional view, the warpage control carrier 100 during a packaging operation in accordance with an embodiment. In this embodiment, a plurality of semiconductor die 602 is encapsulated with an encapsulant (e.g., epoxy material) 604 while being supported by the carrier 100. The semiconductor die 602 may be formed from any suitable semiconductor material (e.g., silicon, germanium, gallium arsenide, gallium nitride) and may include any of digital circuits, analog circuits, RF circuits, memory, signal processor, MEMS, sensors, and the like. Each semiconductor die 602 is attached to plateau regions 104 of the carrier 100 by way of an adhesive, double-sided tape or film, or the like (not shown). The encapsulant 604 is formed surrounding the plurality of semiconductor die 602 during a packaging encapsulation operation. The carrier 100, having channels 106 and 108 filled with the structural material 302, is configured to maintain a substantially planar condition during the encapsulation operation, for example. After the encapsulated semiconductor die 602 are removed from the carrier 100, the carrier may be prepped and reused for further packaging operations.

Figure 7:
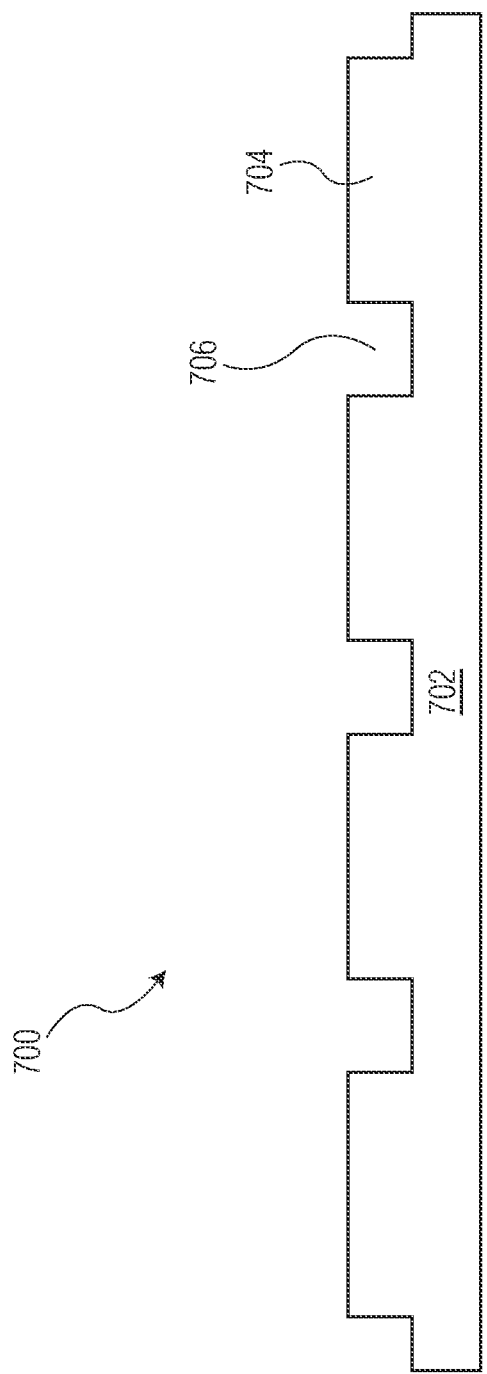
FIG. 7 through FIG. 9 illustrate, in simplified cross-sectional views, an alternative example warpage control carrier at stages of manufacture in accordance with an embodiment.

FIG. 7 illustrates, in a simplified cross-sectional view, an alternative example warpage control carrier 700 at a stage of manufacture in accordance with an embodiment. At this stage of manufacture, a plurality of plateau regions 704 is formed over a base portion 702 of the carrier 700. In this embodiment, the plateau regions 704 are formed by way of a subtractive process. For example, portions of a bulk carrier material are removed (e.g., by way of etching, sawing, laser ablation, or combination thereof) to form channels 706 having desired width and depth dimensions. Int this embodiment, the channels 706 are configured and arranged to form the plurality of plateau regions 704 having desired width, length, and height dimensions. The bulk carrier material of the carrier 700 may be formed from a suitable material such as metal, glass, quartz, ceramic, silicon wafer, or the like.

Figure 8:
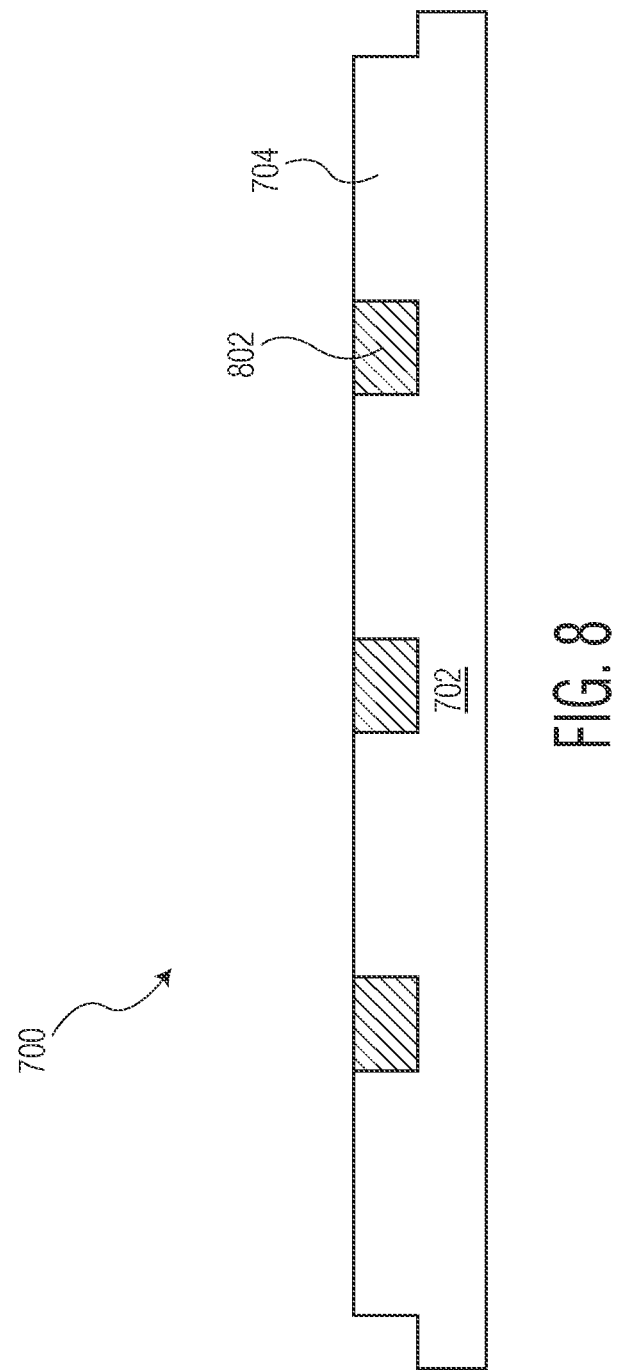

FIG. 8 illustrates, in a simplified cross-sectional view, the warpage control carrier 700 at a subsequent stage of manufacture in accordance with an embodiment. At this stage of manufacture, the channels 706 are filled with a structural material 802. In this embodiment, the channels 706 are formed having a desired width and depth such that when filled with the structural material 802, provides a structural (e.g., stiffening, stress reducing) characteristic to the carrier 700. In this embodiment, the structural material 802 is dispensed or otherwise deposited to fill the channels 706. After the structural material 802 is cured, a top surface of the structural material is substantially coplanar with a top surface of the plurality of plateau regions 704. The structural material 802 may be in the form of a high viscosity material (e.g., metal paste, epoxy underfill material). In some embodiments, the channels 706 of the carrier 700 may be filled using one or multiple structural materials 802.

The structural material 802 is configured to control warpage of the carrier 700 by augmenting structural properties of the carrier 700. The structural material 802 may be configured and arranged in a manner to add rigidity to the carrier, for example, during a packaging operation. In addition, the structural material 802 may be chosen having a desired CTE property which offsets or minimizes a CTE mismatch of materials to reduce warpage of the carrier during the packaging operation.

Figure 9:
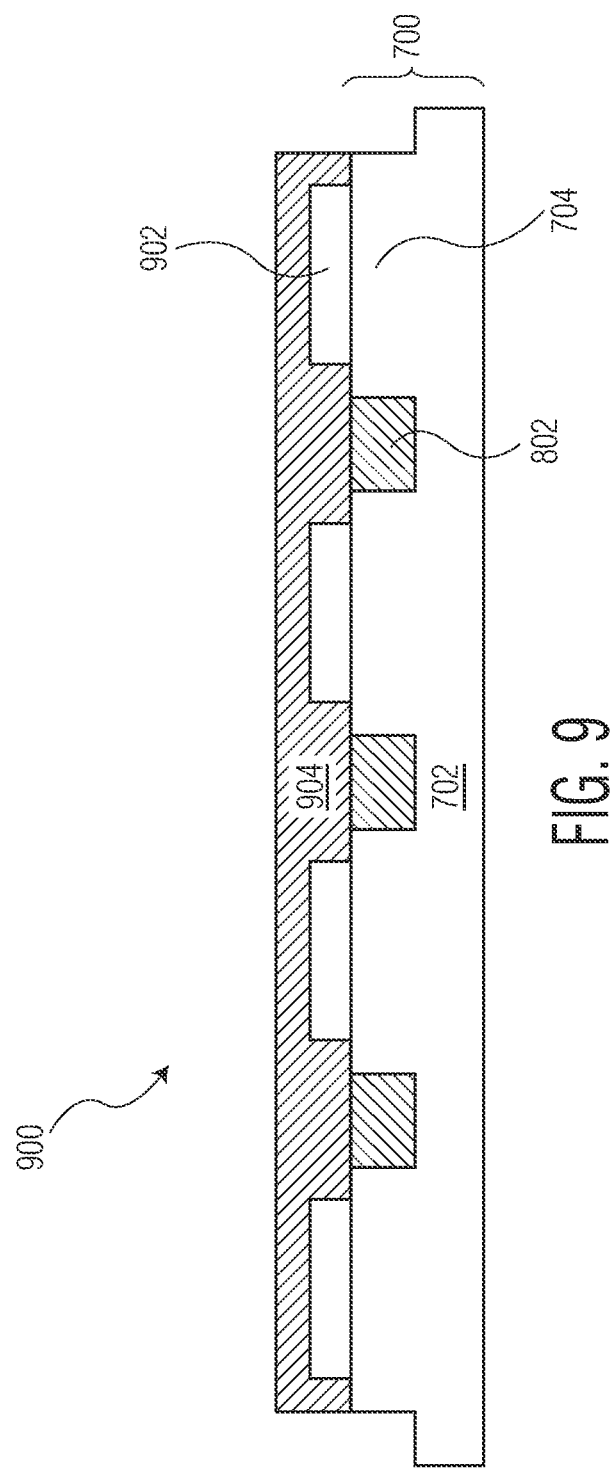

FIG. 9 illustrates, in a simplified cross-sectional view, the warpage control carrier 700 during a packaging operation in accordance with an embodiment. In this embodiment, a plurality of semiconductor die 902 is encapsulated with an encapsulant (e.g., epoxy material) 904 while being supported by the carrier 700. The semiconductor die 902 may be formed from any suitable semiconductor material (e.g., silicon, germanium, gallium arsenide, gallium nitride) and may include any of digital circuits, analog circuits, RF circuits, memory, signal processor, MEMS, sensors, and the like. Each semiconductor die 902 is attached to plateau regions 704 of the carrier 700 by way of an adhesive, double-sided tape or film, or the like (not shown). The encapsulant 904 is formed surrounding the plurality of semiconductor die 902 during a packaging encapsulation operation. The carrier 700, having channels 706 filled with the structural material 802, is configured to maintain a substantially planar condition during the encapsulation operation, for example. After the encapsulated semiconductor die 902 are removed from the carrier 100, the carrier may be prepped and reused for further packaging operations.

Generally, there is provided, a method including forming a carrier having a plurality of plateau regions separated by a plurality of channels, the carrier configured and arranged to support a plurality of semiconductor die during a packaging operation; and filling the plurality of channels with a structural material, the structural material configured to control warpage of the carrier. A top surface of the structural material may be substantially coplanar with a top surface of the plurality of plateau regions. The forming the carrier may further include removing carrier material to form the plurality of channels. The carrier material may be removed by way of etching, sawing, laser ablation, or a combination thereof. The forming the carrier may further include adding material to a base portion of the carrier, the added material configured to form the plurality of plateau regions. The added material may include a material different from the base portion of the carrier. The structural material may have a coefficient of thermal expansion sufficient to maintain a substantially planar condition of the carrier during the packaging operation. The carrier may include a metal, glass, quartz, or ceramic material. The carrier may be further configured for attaching, by way of a releasable adhesive, the plurality of semiconductor die to the plurality of plateau regions during the packaging operation.

In another embodiment, there is provided, an apparatus for manufacturing a packaged semiconductor device including a carrier having a plurality of plateau regions separated by a plurality of channels, the carrier configured and arranged to support a plurality of semiconductor die during a packaging operation; and a structural material disposed in the plurality of channels, the structural material configured to control warpage of the carrier. A top surface of the structural material may be substantially coplanar with a top surface of the plurality of plateau regions. The plurality of channels may be formed in the carrier by way of etching, sawing, laser ablation, or a combination thereof. The structural material may have a coefficient of thermal expansion sufficient to maintain a substantially planar condition of the carrier during the packaging operation. The plurality of plateau regions may include a material different from a base portion of the carrier. The carrier may include a metal, glass, quartz, or ceramic material.

In yet another embodiment, there is provided, a method including forming a carrier having a plurality of vertical channels and a plurality of horizontal channels, the plurality of vertical channels and the plurality of horizontal channels configured and arranged to separate a plurality of plateau regions of the carrier; and filling the plurality of vertical channels and the plurality of horizontal channels with a structural material, the structural material configured to control warpage of the carrier during a packaging operation. The carrier may be configured and arranged to support a plurality of semiconductor die during the packaging operation. The forming the carrier may further include removing carrier material by way of etching, sawing, laser ablation, or a combination thereof to form the plurality of vertical channels and the plurality of horizontal channels. A top surface of the structural material may be substantially coplanar with a top surface of the plurality of plateau regions. The plurality of plateau regions may include a material different from a base portion of the carrier.

By now, it should be appreciated that there has been provided a reusable warpage control carrier for semiconductor device packaging. The warpage control carrier includes a plurality of plateau regions separated by channels. In one aspect, the plateau regions may be formed by way of an additive process whereby material is added to a base portion of the carrier. For example, the plateau regions may be formed by attaching prefabricated structures having desired dimensions to the base portion of the carrier. In this manner, the spacing between the attached prefabricated structures forms the channels. In another aspect, the plateau regions may be formed by way of a subtractive process whereby material is removed from a bulk portion of the carrier. For example, portions of bulk material may be removed by way of etching, sawing, laser ablation, or combinations thereof to form the channels having desired dimensions. As a result, the plateau regions are formed having desired dimensions and spacing from one another. With the plateau regions and corresponding channels formed, a structural material is dispensed or otherwise deposited to fill the channels. The structural material serves to augment structural properties of the carrier in a manner that minimizes warpage during semiconductor device packaging operations. By minimizing warpage during semiconductor device packaging operations, improved yield, reliability, and costs may be realized.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   forming a carrier having a plurality of plateau regions separated by a plurality of channels, the carrier configured and arranged to support a plurality of semiconductor die during a packaging operation; and
   filling the plurality of channels with a structural material, the structural material configured to control warpage of the carrier.

2. The method of claim 1, wherein a top surface of the structural material is substantially coplanar with a top surface of the plurality of plateau regions.

3. The method of claim 1, wherein forming the carrier further comprises removing carrier material to form the plurality of channels.

4. The method of claim 3, wherein the carrier material is removed by way of etching, sawing, laser ablation, or a combination thereof.

5. The method of claim 1, wherein forming the carrier further comprises adding material to a base portion of the carrier, the added material configured to form the plurality of plateau regions.

6. The method of claim 5, wherein the added material comprises a material different from the base portion of the carrier.

7. The method of claim 1, wherein the structural material has a coefficient of thermal expansion sufficient to maintain a substantially planar condition of the carrier during the packaging operation.

8. The method of claim 1, wherein the carrier comprises a metal, glass, quartz, or ceramic material.

9. The method of claim 1, wherein the carrier is further configured for attaching, by way of a releasable adhesive, the plurality of semiconductor die to the plurality of plateau regions during the packaging operation.

10. An apparatus for manufacturing a packaged semiconductor device, the apparatus comprising:
    a carrier having a plurality of plateau regions separated by a plurality of channels, the carrier configured and arranged to support a plurality of semiconductor die during a packaging operation; and
    a structural material disposed in the plurality of channels, the structural material configured to control warpage of the carrier.

11. The apparatus of claim 10, wherein a top surface of the structural material is substantially coplanar with a top surface of the plurality of plateau regions.

12. The apparatus of claim 10, wherein the plurality of channels are formed in the carrier by way of etching, sawing, laser ablation, or a combination thereof.

13. The apparatus of claim 10, wherein the structural material has a coefficient of thermal expansion sufficient to maintain a substantially planar condition of the carrier during the packaging operation.

14. The apparatus of claim 10, wherein the plurality of plateau regions comprises a material different from a base portion of the carrier.

15. The apparatus of claim 10, wherein the carrier comprises a metal, glass, quartz, or ceramic material.

16. A method comprising:
    forming a carrier having a plurality of vertical channels and a plurality of horizontal channels, the plurality of vertical channels and the plurality of horizontal channels configured and arranged to separate a plurality of plateau regions of the carrier; and
    filling the plurality of vertical channels and the plurality of horizontal channels with a structural material, the structural material configured to control warpage of the carrier during a packaging operation.

17. The method of claim 16, wherein the carrier is configured and arranged to support a plurality of semiconductor die during the packaging operation.

18. The method of claim 16, wherein forming the carrier further comprises removing carrier material by way of etching, sawing, laser ablation, or a combination thereof to form the plurality of vertical channels and the plurality of horizontal channels.

19. The method of claim 16, wherein a top surface of the structural material is substantially coplanar with a top surface of the plurality of plateau regions.

20. The method of claim 16, wherein the plurality of plateau regions comprises a material different from a base portion of the carrier.

* * * * *